United States Patent
Burgener et al.

(10) Patent No.: US 7,248,120 B2
(45) Date of Patent: Jul. 24, 2007

(54) STACKED TRANSISTOR METHOD AND APPARATUS

(75) Inventors: Mark L. Burgener, San Diego, CA (US); James S. Cable, San Diego, CA (US)

(73) Assignee: Peregrine Semiconductor Corporation, San Diego, CA (US)

( * ) Notice: Subject to any disclaimer, the term of this patent is extended or adjusted under 35 U.S.C. 154(b) by 0 days.

(21) Appl. No.: 10/875,405

(22) Filed: Jun. 23, 2004

(65) Prior Publication Data

US 2005/0285684 A1   Dec. 29, 2005

(51) Int. Cl.
    *H03F 3/04* (2006.01)
(52) U.S. Cl. .................................. 330/311; 330/277
(58) Field of Classification Search ................ 330/311, 330/277
    See application file for complete search history.

(56) References Cited

U.S. PATENT DOCUMENTS

| | | | |
|---|---|---|---|
| 4,079,336 A * | 3/1978 | Gross ........................ 330/296 |
| 4,241,316 A * | 12/1980 | Knapp ........................ 330/277 |
| 5,032,799 A * | 7/1991 | Milberger et al. .......... 330/311 |
| 5,041,797 A * | 8/1991 | Belcher et al. ............. 330/311 |
| 5,375,256 A | 12/1994 | Yokoyama et al. |
| 6,107,885 A * | 8/2000 | Miguelez et al. ........... 330/276 |
| 6,191,653 B1 | 2/2001 | Camp, Jr. et al. |
| 6,225,866 B1 * | 5/2001 | Kubota et al. .............. 330/295 |
| 6,239,657 B1 | 5/2001 | Bauer |
| 6,297,696 B1 | 10/2001 | Abdollahian et al. |
| 6,308,047 B1 | 10/2001 | Yamamoto et al. |
| 6,380,802 B1 | 4/2002 | Pehlke et al. |
| 6,396,352 B1 * | 5/2002 | Muza ......................... 330/311 |
| 6,449,465 B1 | 9/2002 | Gailus et al. |
| 6,509,799 B1 * | 1/2003 | Franca-Neto ............... 330/305 |
| 6,934,520 B2 | 8/2005 | Rozsypal |
| 2003/0032396 A1 | 2/2003 | Tsuchiya et al. |
| 2003/0224743 A1 | 12/2003 | Okada et al. |
| 2004/0121745 A1 | 6/2004 | Meck |

OTHER PUBLICATIONS

Raab, et al., "Power Amplifiers and Transmitters for RF and Microwave", IEEE Transactions on Microwave Theory and Techniques, vol. 50, No. 3, pp. 814-826, Mar. 2002, USA.

Ueda, et al., "A 5GHz-Band On-Chip Matching CMOS MMIC Front-End", 11th GAAS Symposium—Munich 2003, pp. 101-104, Germany.

Nelson Pass, Pass Labs, "Cascode Amp Design", Audio Electrnoics, pp. 1-4, Mar. 1978.

(Continued)

*Primary Examiner*—Patricia Nguyen
(74) *Attorney, Agent, or Firm*—Jaquez & Associates; Martin J. Jaquez, Esq.; William C. Boiling, Esq.

(57) ABSTRACT

A method and apparatus is described for controlling conduction between two nodes of an integrated circuit via a stack of FETs of common polarity, coupled in series. In an RF Power Amplifier (PA) having appropriate output filtering, or in a quad mixer, stacks of two or more FETs may be used to permit the use of increased voltages between the two nodes. Power control for such RF PAs may be effected by varying a bias voltage to one or more FETs of the stack. Stacks of three or more FETs may be employed to control conduction between any two nodes of an integrated circuit.

27 Claims, 4 Drawing Sheets

OTHER PUBLICATIONS

Lester F. Eastman, P.I., "High Power, Broadband, Linear, Solid State Amplifier", 16th Quarterly Rep. under MURI Contract No. N00014-96-1-1223 for period Jun. 1, 2000-Aug. 31, 2000, Sep. 2000, pp. 1-8.

Jeon, et al., "A New "Active" Predistorter with High Gain Using Cascode-FET Structures", IEEE Radio Frequency Integrated Circuits Symposium, 2002, pp. 253-256.

Hsu, et al., "Comparison of Conventional and Thermally-Stable Cascode (TSC) AlGaAs/GaAs HBTs for Microwave Power Applications", Jrnl of Solid-State Electronics, V. 43, Sep. 1999, 2 pages, U.S.A.

Kim, et al., "High-Performance V-Band Cascode HEMT Mixer and Downconverter Module", IEEE Transactions on Microwave Theory and Techniques, vol. 51, No. 3, p. 805-810,Mar. 2003.

Mishra, et al., "High Power Broadband Amplifiers for 1-18 GHz Naval Radar" University of California, Santa Barbara, pp. 1-9, Jul. 1, 1998.

Schlechtweg, et al., "Multifunctional Integration Using HEMT Technology", Fraunhofer Institute for Applied Solid State Physics, (date uncertain, believed Mar. 1997).

Rohde, et al., "Optic/Millimeter-Wave Converter for 60 Ghz Radio-Over-Fiber Systems", Fraunhofer-Institut for Angewandte Festkörperphysik Freiburg i. Br., Apr. 1997, pp. 1-5.

* cited by examiner

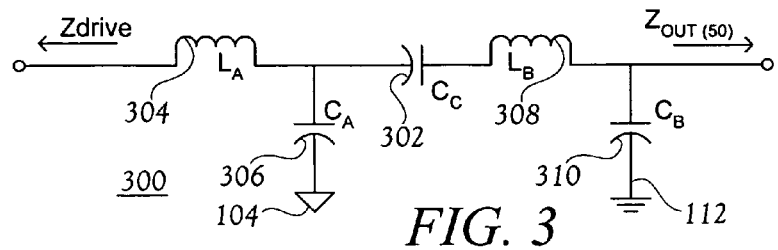
*FIG. 3*
*FIG. 4*
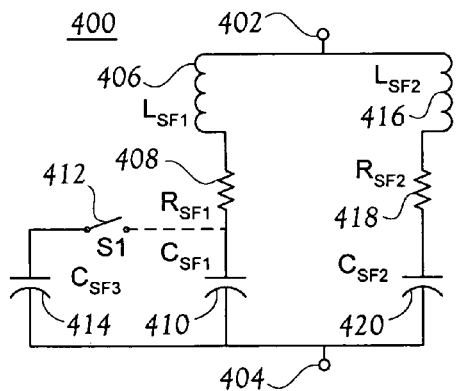
*FIG. 5*
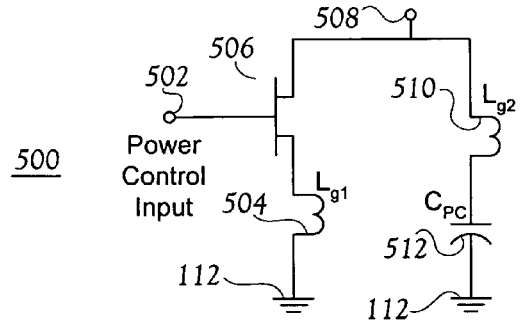
*FIG. 6*
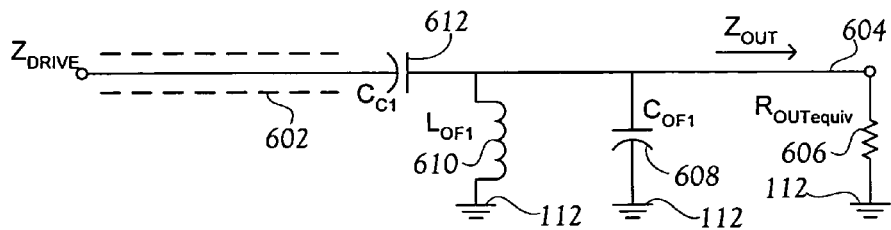

STACKED TRANSISTOR METHOD AND APPARATUS

CROSS REFERENCE TO RELATED APPLICATIONS

This application is related to and commonly assigned U.S. application Ser. No. 10/267,531 (now U.S. Pat. No. 6,804,502, issued Oct. 12, 2004), filed Oct. 8, 2002, entitled "Switch Circuit and Method of Switching Radio Frequency Signals," which claims the benefit under 35 U.S.C. § 119 (e) of U.S. Provisional Application No. 60/328,353, filed Oct. 10, 2001, entitled "Silicon-on-Insulator RF Switches," both of which applications are hereby incorporated in their entirety by reference.

BACKGROUND OF THE INVENTION

1. Field of the Invention

This invention relates broadly to integrated electronic circuits, and more specifically to FET circuits for controlling voltages that exceed individual FET breakdown voltages.

2. Related Art

Wireless communications devices, especially handheld devices, are undergoing sustained development. Perhaps more than any other factor, the extreme popularity of cellular mobile telephones has motivated improvements in efficiency, speed, and cost-effectiveness for RF transmission circuits in handheld devices. Enhancing the efficiency of such circuits is highly desirable so that the size of the required batteries may be reduced, while their life is extended. Cost-effectiveness is clearly always desirable for consumer products, particularly when such products require periodic replacement to stay abreast of changes in the technology. Additionally, transmitters must meet stringent emission limits, which have been established in order to facilitate high communication density at minimal power levels.

A transmission Power Amplifier (PA) is a subcircuit found in most mobile wireless transmitters (e.g., cellular telephones). The PA subcircuit is typically the most power-consuming portion of such transmitters, and, also typically, is the source of the most significant unintended or "spurious" emissions. In order to extend battery life, to meet stringent spurious emissions standards, and to minimize the cost of these high-volume consumer items, there is a need to improve the speed and efficiency, while reducing spurious emissions and manufacturing costs, for such PA subcircuits.

A range of PA topologies have been developed, each having different advantages. For example, PAs of class A, B, C, D, E and F are well known in the art. PAs of classes A–C are designed to permit power dissipation in amplifying devices that operate in a linear region, which is to say that such devices intentionally conduct current while voltage is present across the device.

PAs of classes D, E and F attempt to reduce the power loss caused by such linear operation by employing amplifier devices as switches, rather than as linear amplifiers. However, the pulse-type outputs from such amplifiers generally require extensive filtering in order to establish a narrow-band sinusoidal output, as is typically required. While normal operation of class D–F PAs does not intentionally cause drive element devices to conduct while voltage is present across the devices, even switched devices consume real power due to current flowing while voltage is present during finite switching periods. Moreover, compared to drive devices in analog PAs operating at the same transmission center frequency, drive devices in class D–F switching circuits must often operate at much higher frequencies. The higher frequency signals include significant energy at undesired frequencies, and such undesired signal energies not only consume circuit power, but also require filtering to meet emission limits.

Integration of devices is generally desirable in order to improve various features of the resulting product, such as operating frequency and reliability, and may also reduce overall manufacturing costs. Field Effect Transistors (FETs) are extremely popular for both linear amplification and switching purposes in integrated circuits. However, integrated circuit (IC) FETs have a limited capability to withstand voltage between any two nodes, including gate-source, gate-drain, and drain-source node pairs. Such voltage withstand limitations may particularly impair the usefulness of IC FETs in high power switching circuits, in which inductive voltages may greatly exceed the supply voltage. As a particular example, the transmission output power capability of an RF PA is highly dependent upon the amplitude of the output voltage. One of the difficulties with existing PA technologies is that many otherwise desirably high-speed devices are fabricated using processes that tend to yield FETs having relatively low breakdown voltages. It is very desirable to solve this problem ant thereby provide a wider voltage range while retaining other desirable integrated device features. Such a solution enables integration on monolithic integrated circuits of power and control features that previously required separate processing, such as PA features and RF switch features. Integration of interacting circuits that were previously discrete will enhance yield and predictability, due to the process matching that is inherent in monolithic integration.

A circuit and method is described herein that enables stacked integrated circuit FETs to control signals that substantially exceed the voltage withstand capability of individual FETs. Such a circuit or method may be used in wide range of applications, though it was developed and is described herein primarily in the context of RF PAs. FET stacks may be operated in either linear or switching modes, and are well suited for controlling conduction between two nodes in a circuit that may operate at high frequency. They are particularly well suited for use in integrated circuits, where considerations of fabrication efficiencies often dictate that all FETs have substantially similar, and thus similarly limited, voltage breakdown characteristics. In such integrated circuits, FET stacks enable a designer to take advantage of efficiencies that may accrue from operation at higher voltages, without sacrificing the fabrication efficiencies that follow from employing device fabrication parameters that are optimized for devices having a low voltage capability.

SUMMARY

A method and apparatus is described that enables FETs to control signals that greatly exceed breakdown voltages of the FETs. One embodiment is an integrated circuit including a multiplicity of FETs in a stack having drain-source channels coupled in series to control conductivity between nodes in a circuit. A control signal is coupled to a first FET to cause changes in conductivity of the first FET, and conductivity of the remaining FETs is enslaved to the conductivity of the first FET. A voltage withstand capability across the series combination of the FET stack may be substantially equal to a sum of drain-source voltage withstand capabilities of the individual FETs of the stack. A gate of each FET other than the first FET may be capacitively coupled to a common voltage.

Another embodiment is an integrated RF power amplifier (PA) that includes a plurality of FETs of a common polarity having drain-source channels coupled in series, so as to control conductivity between a drive output and a reference in the RF PA with a characteristic drive impedance at an operating frequency $f_0$. The RF PA further includes a shunt filter configured to provide a local minimum impedance between the drive output and the reference at a harmonic of $f_0$, where the minimum impedance is non-zero and primarily resistive. The minimum impedance may be approximately equal to the characteristic drive impedance.

A further embodiment is an integrated RF power amplifier (PA) that includes a plurality of FETs of a common polarity having drain-source channels coupled in series, so as to control conductivity between a drive output and a reference in the RF PA with a characteristic drive impedance at an operating frequency $f_0$. The RF PA further includes a shunt filter configured to provide local minimum impedances between the drive output and the reference at a plurality of frequencies, including an even harmonic of $f_0$ and a non-unity odd harmonic of $f_0$. The minimum impedances may be approximately equal to the characteristic drive impedance.

One embodiment is a method of controlling conduction between two nodes of an integrated circuit, and includes disposing a multiplicity of common-polarity FETs in drain-source series between the two nodes. The embodiment also includes driving a first FET of the multiplicity of FETs with a drive signal to affect a conductivity of the first FET, and enslaving conductivities of all other FETs of the stack to the conductivity of the first FET.

Another embodiment is a method of amplifying RF signals, including providing a plural-FET stack to control an output drive node with respect to a reference node at a characteristic impedance at an operating frequency $f_0$. The embodiment includes disposing, between the output drive node and the reference node, a shunt filter having a non-zero, primarily resistive local minimum impedance at a harmonic of $f_0$. The local minimum impedance may be approximately equal to the characteristic impedance of the FET stack.

A further embodiment is a method of amplifying RF signals, including providing a plural-FET stack to control an output drive node with respect to a reference node at a characteristic impedance at an operating frequency $f_0$. The embodiment includes disposing, between the output drive node and the reference node, a shunt filter having local minimum impedances at a plurality of frequencies, including at an even harmonic of $f_0$ and at a non-unity odd harmonic of $f_0$. The local minimum impedance may be approximately equal to the characteristic impedance of the FET stack.

BRIEF DESCRIPTION OF THE DRAWINGS

Embodiments of the present invention will be more readily understood by reference to the following figures, in which like reference numbers and designations indicate like elements.

FIG. 3 is a simplified schematic diagram of an impedance matching and coupling bandpass filter useable in a PA such as shown in FIG. 1.

FIG. 4 is a simplified schematic diagram of a shunt filter useable in a PA such as shown in FIG. 1.

FIG. 5 is a simplified schematic diagram of a shunt power control circuit useable in a PA such as shown in FIG. 1.

FIG. 6 is a simplified schematic diagram of an output filter for Class F operation of a PA such as shown in FIG. 1.

DETAILED DESCRIPTION

Power Amplifier Overview

Figure 1:
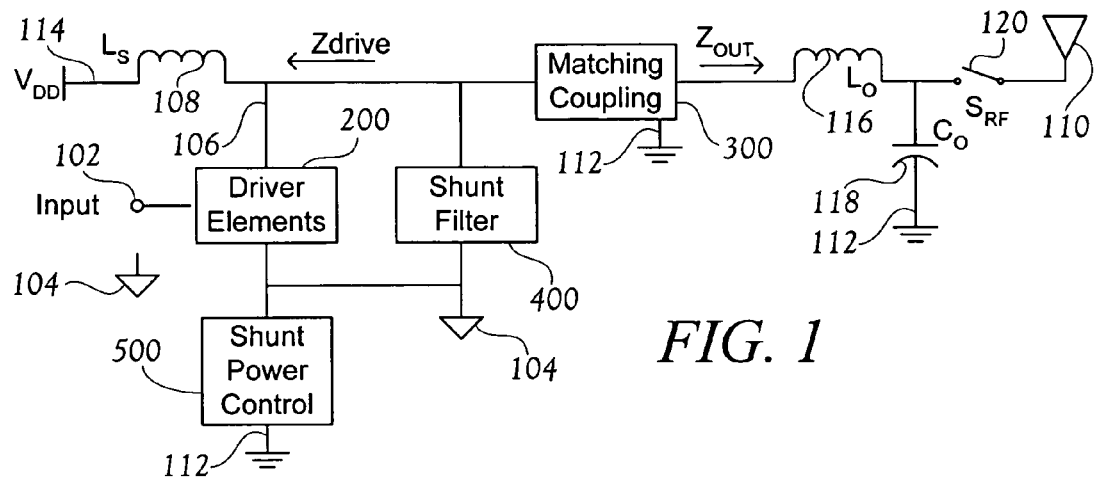
FIG. 1 is a block schematic diagram of RF power amplifier (PA) circuitry.

FIG. 1 is a block diagram of an RF power amplifier (PA). The illustrated RF PA is quite general, in that varying the biasing of devices in a driver elements block 200, and/or varying details of the other blocks, will permit the RF PA illustrated in FIG. 1 to operate in any of classes A, B, C, E or F. FIGS. 2–5 each show an exemplary circuit to implement one of the blocks shown in FIG. 1.

An input 102 is provided to the PA with respect to a circuit reference, or common, 104. The input 102 generally comprises a properly biased signal at a center drive frequency, $f_0$. In response to the input 102, the driver elements block 200 controls conduction between a drive output node 106 and the circuit common 104. The driver elements block 200, in conjunction with current from $V_{DD}$ via an RF choke $L_S$ 108, provides a signal having a particular impedance Zdrive. Zdrive may vary with frequency, but will refer to the drive impedance at the center operating frequency $f_0$, unless otherwise indicated. A shunt filter 400 may be coupled between the drive output node 106 and the circuit common 104. Numerous different filtering arrangements may be used, some examples of which are described subsequently herein.

An antenna 110 has a characteristic impedance $Z_{OUT}$, generally 50 Ω (at the center frequency $f_0$ unless otherwise indicated). A block 300 is typically required to provide matching and coupling between the drive node 106 (at Zdrive) and the output at $Z_{OUT}$. Following the matching and coupling, an output filter section such as the combination of $L_O$ 116 and $C_O$ 118 may typically be disposed in the signal path before an RF switch, $S_{RF}$ 120, which appropriately couples the output to the antenna 110. Because the PA circuit is integrated on a semiconductor device, and the antenna 110 is typically external to the IC comprising the PA, the antenna 110 often operates with a different reference voltage, for example a chassis ground 112, which has a non-zero impedance to the circuit common 104. Accordingly, the matching-coupling block 300, as well as the filter section 116–118, has an output that is referenced to chassis ground 112.

Power control may be optionally be provided, for example, by means of a shunt power control block 500, which may provide a voltage offset between chassis ground 112 and circuit common 104 to reduce the amplitude of signals received by the antenna 110.

Stacked-FET Drivers

Figure 2:
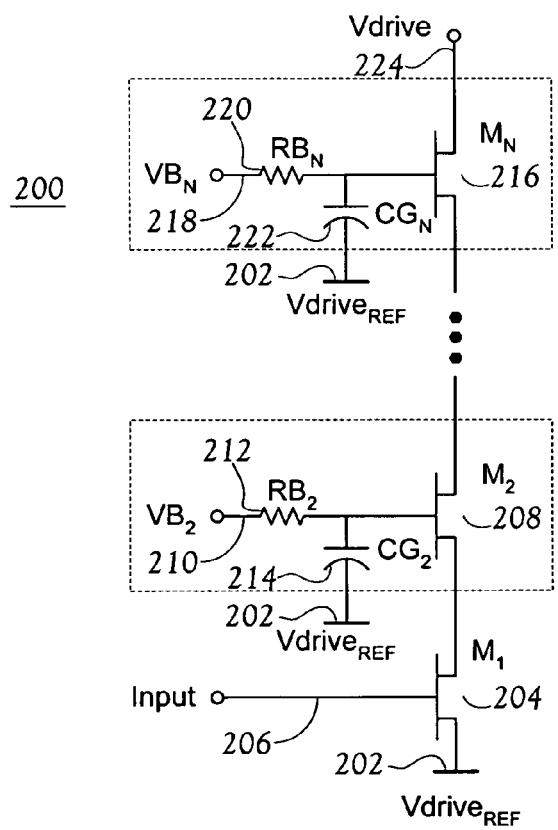
FIG. 2 is a generalized schematic diagram of a stacked-FET control circuit useable with a PA such as shown in FIG. 1.

FIG. 2 is a simplified schematic diagram of a stacked-FET circuit that may be used for the driver elements block 200 in the RF PA of FIG. 1, for controlling conduction between the drive output node 106 and the circuit common 104. The stack includes two or more FETs of the same polarity, i.e., all FETs in a stack are N-channel FETs, or all are P-channel FETs, or at least all FETs in a stack operate substantially similarly as each other.

The FET stack 200 of FIG. 2 is configured to control conduction between two nodes of an integrated circuit. A terminal Vdrive$_{REF}$ 202 is connected to one of the two nodes (e.g., circuit common 104 in FIG. 1), while a terminal Vdrive 224 is connected to the other node (e.g., Vdrive 106 in FIG. 1). For N-channel FETs (N-FETs) as illustrated in FIG. 2, Vdrive$_{REF}$ 202 will be connected to the more negative of the two nodes, for example to circuit common 104 in FIG. 1. The terminal Vdrive$_{REF}$ 202 is coupled to the source of a first FET of the stack 200, M$_1$ 204.

The FET stack 200 is controlled by means of an input signal, relative to terminal Vdrive$_{REF}$ 202, that is coupled to the gate of the signal-input FET M$_1$ 204 via an input terminal 206. The drain of M$_1$ 204 is coupled to the source of a second FET M$_2$ 208. The gate of M$_2$ 208 is provided with a bias voltage VB$_2$ 210 via a bias resistor RB$_2$ 212, and is decoupled to Vdrive$_{REF}$ 202 via CG$_2$ 214. In some embodiments, these two FETs are sufficient, when properly configured to divide applied voltages so as to avoid exceeding breakdown limits of either device, to serve as a conduction controlling circuit to handle increased voltages in a circuit such as a PA or a quad mixer.

In other embodiments, however, one or more additional FETs of the same polarity are connected in series with M$_1$ 204 and M$_2$ 208. Such additional FETs are represented in FIG. 2 by an Nth FET, M$_N$ 216. As for each additional FET of the stack, the source of M$_N$ 216 is coupled to the drain of the preceding FET of the stack, i.e., to the drain of FET M$_{N-1}$ (not shown, though if N=3 then M$_{N-1}$ is M$_2$ 208). The drain of the last FET of the stack, MN 216, is coupled to the output terminal Vdrive 224. Associated with each additional FET is a biasing voltage VBN 218, which is coupled to the gate of the FET via a bias impedance such as RB$_N$ 220, and a capacitor CG$_N$ 222 for coupling the gate to a voltage such that the FET is enslaved to conduction by the signal-input FET (here, M$_1$ 204). As shown, enslaving may be effected by coupling the gate of each additional FET to Vdrive$_{REF}$ 202.

FET stacks with at least nine FETs in series have been fabricated or simulated, and stacks of even more series FETs are certainly possible Note that physical circuit couplings generally include finite capacitance, inductance, and resistance. For many purposes it is preferred that the FETs of the FET stack 200 be coupled with minimal impedance in series, drain to source. However, impedance may be intentionally added to such couplings. For example, it may be desirable to more closely control a drive impedance, and to dissipate heat in specific resistive series coupling elements rather than within the FETs themselves. It may also be desirable to add impedance between the FETs of the FET stack 200 so as to tune the conductance of the drive circuit.

FET Stack Biasing

In some embodiments, the FETs of a FET stack may all have substantially similar voltage withstand capabilities, such as breakdown voltages V$_{GS(br)}$, V$_{DS(br)}$, and V$_{DG(br)}$. For some integrated circuit fabrication processes, these values will be similar from FET to FET. Moreover, for some integrated circuit fabrication processes, the breakdown voltages V$_{GS(br)}$, V$_{DS(br)}$, and V$_{DG(br)}$ may be approximately equal to each other. Proper biasing will usefully ensure that none of these breakdown voltages is exceeded during normal operation of the circuit. In some embodiments, with proper biasing, voltage excursions between Vdrive$_{REF}$ 202 and Vdrive 224 may be permitted to approach a sum of V$_{DS}$ breakdown voltages for each constituent FET of the stack.

Biasing and coupling the FETs of a FET stack as described below may prevent voltages from exceeding any maximum allowable node to node voltage for any FET of the stack, even when the total voltage impressed from Vdrive 224 to Vdrive$_{REF}$ 202 is nearly equal to the sum of the maximum allowable V$_{DS}$ for the individual FETs of the stack. Unless otherwise noted, the maximum allowable voltage between any two nodes of the FETs (i.e., V$_{GS}$, V$_{DS}$, and V$_{DG}$) are generally assumed to be substantially equal, both for the various nodes of each FET, and from FET to FET, which accords with an exemplary semiconductor fabrication processes. However, the skilled person may readily extend the principles set forth below to encompass situations in which these maximum allowable voltages are not equal. Also, the calculations set forth below for N-channel FET stacks may be applied to P-channel FET stacks with appropriate inversions of polarities and references.

The impedance of the gate drive of M$_1$ may be selected according to ordinary transistor driving principles. In this exemplary embodiment, V$_{DS}$(max) is the same for all FETs of the stack. V$_{DS}$ for M$_1$ will therefore approximate (Vdrive–Vdrive$_{REF}$)/N. For each FET M$_{"X"}$, for X values from 2 to N, the effective value of each biasing resistor RB$_X$ is selected to control a time constant, $\tau_{GX}$, of the gate coupling. $\tau_{GX}$ is, approximately, the sum of effective capacitances of the gate coupling capacitor CG$_X$ plus the parasitic gate capacitances C$_{GPX}$, multiplied by the series impedance to a biasing voltage. Such series impedance is typically resistive, and will be designated RB$_{X(equiv)}$. It may be desirable for $\tau_{GX}$ to be much longer than the period 1/f$_0$ of the center drive frequency, preferably 5–20 times as long. Thus, a good design center goal is:

$$RB_{X(equiv)}(C_{GX}+C_{GPX})=10/f_0 \quad \text{(Eqn. 1).}$$

With respect to Vdrive$_{REF}$, and for Vpeak that is the maximum expected value of Vdrive, one proper bias voltage value is simply a proportional portion of ½ of Vpeak:

$$VB_X=X(Vpeak)/2N \quad \text{(Eqn. 2)}$$

Thus, an example in which N=4 yields: VB$_2$=Vpeak/4, VB$_3$=3(Vpeak)/8, and VB$_4$=Vpeak/2.

FET Stack Gate Signal Coupling

Figure 7:
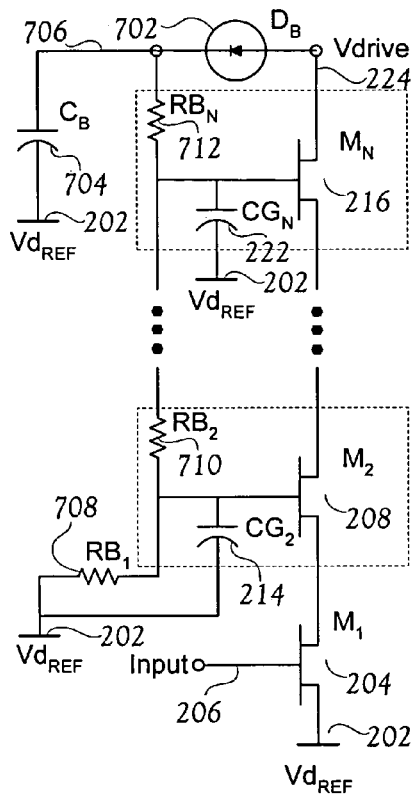
FIG. 7 is a schematic diagram illustrating alternative biasing features for a stacked-FET amplifying circuit.

In FIGS. 2 and 7, each gate node (V$_{GX}$) is coupled via the capacitor C$_{GX}$ to the reference voltage Vdrive$_{REF}$. Each gate node is also coupled to a DC bias voltage via a bias resistor. In this configuration, the effective drive voltage V$_{GSX}$ for each FET M$_X$ of the FET stack depends upon the voltage excursion of its source, V$_{SX}$, in conjunction with the impedance from the source to the gate node, and from the gate node to AC ground. These impedances are dominated by the gate-source capacitance and the coupling capacitor CG$_X$. Appropriate values for CG$_X$ may be determined as follows.

In the exemplary embodiment, the maximum voltage between each node pair of each FET is the same. The voltage excursions of the source of FET M$_2$ must therefore not exceed the maximum V$_{DS}$ for M$_1$. As such, the value of CG$_2$ is unlimited, and desirably large, for effecting AC grounding of the gate of M$_2$ and thereby providing the largest common-gate drive signal to M$_2$. V$_{GS}$ (max) will not be exceeded for M$_2$ if the (DC) voltage on the gate is maintained within the range of the source voltage excursions. However, if (contrary to the assumptions above) the maximum V$_{DS1}$ exceeds the maximum $V_{GS2}$, then $CG_2$ values may need to be limited in a manner analogous to that described below for $CG_X$ for X from 2 to N.

The voltage excursion of the source of each FET $M_X$ with respect to $Vdrive_{REF}$, $\Delta V_{SX}$, will be equal to the drain voltage excursion for $M_{(X-1)}$, $\Delta V_{D(X-1)}$. This voltage, presuming equal division between the various FETs, is X(Vpeak−Vmin)/N. For Vmin=0, this is simply X(Vpeak)/N, and $\Delta V_{SX}$=(X−1)(Vpeak)/N.

The parasitic gate-source capacitance $C_{GS}$ of a FET increases, when $V_{GS}$=VGS(on), to $C_{OX}$, the oxide capacitance. $C_{OX}$ for a particular FET $M_X$ is designated $C_{OXX}$. Because $CG_X$ is coupled to the reference voltage $Vdrive_{REF}$, the net $V_{GSX}$ will be capacitively divided between $CG_X$ and $C_{OXX}$. Thus, the gate-source excursion $\Delta V_{GSX}$=($\Delta V_{SX}$)/(1+ $C_{OXX}/C_{GSX}$). Presuming equal maximums for $V_{GS}$ and $V_{DS}$, it is desired to limit $\Delta V_{GSX}$≦Vpeak/N. Thus, substituting for $\Delta V_{GSX}$ and $\Delta V_{SX}$, Vpeak/N≧[(X−1)(Vpeak)/N]/[1$C_{OXX}$/$C_{GSX}$]. Appropriate consolidation yields:

$$C_{GX} \leq C_{OXX}/(X-2) \qquad \text{(Eqn. 3)}$$

For X=2, $C_{GX}$≦infinity, as expected. Also as expected, excessive values for $C_{GX}$ will tend to cause excessive gate-source voltage excursions ($\Delta V_{GSX}$). The inequality of Eqn. 3 may prevent excessive voltages between nodes of the devices. However, $C_{GX}$ may desirably be as large as is allowable so as to provide the largest allowable drive levels without exceeding breakdown voltages. Accordingly, the inequality of equation 3 may be treated as an approximate equality.

The result set forth above may not apply when it is desired to divide voltage differently between different FETs of the stack, or when maximum gate-source voltages differ from maximum drain-source voltages. However, the skilled person will have no difficulty determining desirable values for $C_{GX}$ for such various circumstances by calculations corresponding to those set forth above, with appropriately modified assumptions. Because the capacitors $C_{GX}$ must sustain voltages exceeding the bias voltage of the corresponding FET $M_X$, a metal-insulator-metal (MIM) capacitor is a good choice. Moreover, the capacitance of both (parasitic) oxide capacitors and MIM capacitors is a direct function of geometry. Certain fabrication variables, such as lithographic variables, therefore tend to have similar effects on both types of capacitances, leaving the ratio of such capacitances relatively immune to such variables.

FIG. 3 shows an exemplary matching, coupling and filtering block 300, which, as shown in FIG. 1, may be disposed between the drive output node 106 and the antenna 110. The matching function transforms the typically 50 Ω characteristic impedance of the antenna, $Z_{OUT}$, to the characteristic impedance of the drive output node 106 (both at the operating frequency $f_0$) in a manner well known to those of skill in the art. The coupling capacitor $C_C$ 302 blocks DC from the drive output node 106, and may be selected to have an impedance at $f_0$ that is less, and desirably much less, than the impedance to chassis ground 112, or to circuit common 104, from either side of the capacitor 302. The matching circuit 300 includes an "A" filter element comprising an inductor $L_A$ 304 and a capacitor $C_A$ 306, which may be fabricated as part of the integrated circuit. The matching circuit 300 also includes a "B" filter element comprising an inductor $L_B$ 308 and a capacitor $C_B$ 310 to chassis ground 112 (to which the antenna 110 of FIG. 1 is referenced). The coupling capacitor $C_C$ 302, as well as the inductor LB 308 and the capacitor $C_B$ 310 may be fabricated on an integrated circuit with the PA, but some of these devices are typically external to the integrated circuit.

Shunt Filtering

FIG. 4 illustrates an optional shunt filter 400. A node 402 of shunt filter 400 may be connected to the drive output node 106 of FIG. 1, and an opposite node 404 may be connected to circuit common 104 of FIG. 1. The shunt filter 400 may provide local minimum impedances at each of one or more particular frequencies. The minimum impedances may be matched to the drive circuit impedance (as established, for example, by the drive elements 200 and the RF choke $L_S$ 108). The shunt filter elements may be fabricated as part of the integrated circuit that includes the drive elements 200, thus reducing loop areas of currents passing through the elements of the shunt filter 400.

A shunt filter 400 for FIG. 1 may be a "transmission line filter" fabricated of reactive elements that are substantially distributed over an appropriate length, for example ¼ wavelength at $f_0$. Such a transmission line may be coupled to circuit common via a resonant circuit having a maximum impedance at $f_0$, such as a filter 600 as illustrated in FIG. 6 and described in more detail hereinbelow. Such a configuration for the shunt filter 400 provides local impedance minimums (approximately zero) at each even harmonic of $f_0$, and local maximum impedances at each odd harmonic of $f_0$. Stated more concisely, such a configuration may typically be said to reflect all odd harmonics, and to short all even harmonics.

However, the shunt filter 400 illustrated in FIG. 4 generally differs from such a transmission line filter. First, the shunt filter 400 may employ lumped, rather than distributed, elements. Consequently, local minimum impedances may occur at selected frequencies rather than at all odd, or at all even, harmonics of a resonant frequency (e.g., $f_0$). Second, the filter may employ series resistive elements to intentionally establish a non-zero value of local minimum impedance. It may be useful, for example, to control the local impedance minimum values so as to match an impedance of the drive circuit at the corresponding frequency (or, alternatively, at $f_0$). As a result of such differences between the circuit illustrated in FIG. 4 and a conventional transmission line filter, the magnitudes of currents in current loops may be reduced. Moreover, drive element power dissipation may be reduced at the frequencies corresponding to the selected minimum impedances.

In FIG. 4, a first shunt filter element includes $L_{SF1}$ 406, $R_{SF1}$ 408, and $C_{SF1}$ 410. These components establish a local minimum impedance at a particular frequency, with the impedance increasing for both higher and lower frequencies. A switch S1 412, in conjunction with an additional capacitor $C_{SF3}$ 414, represents an optional circuit for adjusting the frequency of the minimum impedance of the first filter element. As shown, the effective value of the series capacitor of the first filter element is increased when S1 is closed and $C_{SF3}$ is disposed in parallel with $C_{SF1}$ 410.

Of course, such frequency adjustability may be effected in numerous different manners. For example, S1 412 may be a FET for electronically switching the frequency. Additionally or alternatively, $C_{SF1}$ 410, as well as optional $C_{SF3}$ 414, may be varactors (with the corresponding addition of an appropriate control circuit for the DC voltages on such varactors). Moreover, the capacitor $C_{SF3}$ 414 may be disposed in series connection, rather than parallel connection, with $C_{SF1}$ 410, in which event the switch S1 may be configured to bypass the capacitor $C_{SF3}$ 414. Yet further, analogous techniques may be employed to vary inductance, rather than capacitance. For example, the switch S1 412 may selectably bypass a second inductive element, so as to vary the effective inductance of the first shunt filter element.

The second shunt filter element comprises an inductor $L_{SF2}$ 416, a resistive element $R_{SF2}$ 418, and a capacitor $C_{SF2}$ 420. The resonant frequency of the second filter element (or, indeed, of any further filter element) of the shunt filter 400 may be varied by similar techniques as outlined above with respect to the first filter element. It may be useful to have a minimum impedance that is substantially resistive, and/or that is non-zero. In one embodiment, the first and second filter elements are designed to provide local minimum impedances, at a second harmonic and a third harmonic of the operating frequency $f_0$ respectively which are approximately equal to the drive circuit impedance. Though only two filter elements are illustrated, additional harmonics may desirably be treated with additional filter elements (not shown).

PA Output Power Control

FIG. 5 illustrates elements of one possible shunt power control circuit 500 for the PA of FIG. 1. A power control input 502 may establish a bias with respect to chassis ground 112. An inductive impedance Lg1 504 (which may reflect, for example, the inductance of a bond wire) is illustrated between chassis ground and the source of a power control FET $M_{PC}$ 506. A connection 508 may be coupled to circuit common 104 in FIG. 1. An inductance Lg2 510 typically exists in series with a bypass capacitor for the power control circuit, $C_{PC}$ 512. Assuming that the DC voltage $V_{DD}$ is with respect to chassis ground 112, the substantially DC voltage established across CPC 512 will reduce the effective supply voltage with respect to circuit common 104.

Other techniques may also be used to control the output power for a circuit as shown in FIG. 1, particularly when operated in a Class F configuration (rectangular wave input control). Such other techniques may be used either in addition to, or instead of, shunt power control as described above with respect to FIG. 5.

As a first example, referring also to FIG. 2, the bias voltages on the FETs $M_2$ 208 ... $M_N$ 216 may be adjusted. Efficiency will decrease, but power output will decrease more rapidly. As noted above, bias may generally be set such that $VB_X = X(Vpeak)/2N$. However, if VB2 is decreased well below the calculated value, the output voltage Vdrive (in Class F operation) will also decline. Thus, for example, a circuit may be configured as shown in FIG. 7, except that the effective average voltage at the gate of $M_2$ 208 may be controllably reduced. This may be accomplished by making the value of $RB_1$ 708 variable (e.g., by means of a parallel FET). Alternatively, the value of $RB_1$ 708 may be reduced, and $RB_1$ 708 may be coupled to a variable voltage source rather than to reference 202. Reducing the bias voltage will cause corresponding reductions in drive output voltages. As described below in more detail, the self adjusting bias supply circuit of FIG. 7 will permit the bias on $RB_N$ to gradually follow the reductions in Vdrive(peak) that are caused by varying the bias voltage on the gate of $M_2$.

PA output power may also be controlled by varying the amplitude of the drive signal. The conduction impedance of the drive elements will be higher when driven with a lower amplitude rectangular wave, resulting in a smaller effective drive voltage. The efficiency of this technique is typically comparable to the efficiency of varying bias voltages.

Alternative PA Embodiments

FIG. 6 is a simplified schematic diagram of a filter circuit 600 that may be employed in a manner similar to the shunt filter 400 in FIG. 1 to form a versatile PA architecture. The drive output node 106 of FIG. 1 may be coupled to a Zdrive node as an input to 600. The Zdrive node may be coupled via a ¼ wavelength transmission line 602 and a coupling capacitor $C_{C1}$ 612 to an output filter section. The output filter section may comprise a parallel combination of $L_{OF1}$ 610 and $C_{OF1}$ 608, resonant at the operating frequency $f_0$. Unlike some embodiments of shunt filters 400, the output filter section of FIG. 6 is typically not part of the PA integrated circuit, and thus is referenced to chassis ground 112 rather than to circuit common. The impedance of this bandpass filter to ground 112 falls rapidly as the frequency deviates from $f_0$, and, therefore, the harmonics of the operating frequency are effectively shorted to ground at the output filter end of the transmission line 602. The standing waves of the properly tuned ¼ wavelength transmission line therefore provide a high impedance at each odd harmonic, and a low impedance at each even harmonic, as seen at the Zdrive node. A $Z_{OUT}$ node 604 may be coupled to a further output filter section 116–118, an RF switch 120, and antenna 110 as shown in FIG. 1. A matching network (not shown) may also be required, similar to that illustrated in FIG. 3 with the coupling capacitor $C_C$ 302 omitted. Such further filtering and matching circuits, or a transmission line coupled thereto, will ideally appear to the filter circuit 600 as a resistive impedance $R_{OUTequiv}$ 606 at the operating frequency $f_0$.

Modified as described above, the circuit of FIG. 1 may be operated as an RF PA of Class A, Class B, Class C, Class E or Class F. For Class A operation, the input signal 102 is sinusoidal and does not cause the current through $M_1$ 202 of FIG. 2 to go to zero. For Class B operation, the input signal 102 is sinusoidal but $M_1$ 202 conducts only 50% of the time (conduction angle 180 degrees). Operation may be Class C, with a conduction angle less than 180 degrees, which yields some efficiency improvement as compared to the Class B operation. In each case the FETs $M_2$ to $M_N$ are enslaved to $M_1$, and the FET stack of FIG. 2 functions substantially as a single device.

The circuit of FIG. 1, configured as described immediately above, may also be operated as a Class F RF PA. For Class F operation the input signal is preferably a square wave having a duty cycle that causes the circuit 200 to conduct at precisely a 50% duty cycle. The output voltages resulting from Class F operation generally increase substantially when the conduction duty cycle deviates from 50%. Unfortunately, ordinary manufacturing component variations tend to cause the duty cycle to deviate from 50%, and consequently the circuit may not readily be able to safely and reliably utilize the full voltage withstand capability of the drive element(s).

Alternative Bias and Slaving

Embodiments of a FET stack, as described herein, may include a signal-input FET that receives a drive signal coupled to its gate with respect to a reference voltage that is coupled to its source. The remaining FETs of the stack may be enslaved to the signal-input FET, such that they conduct under the control of conduction in the signal-input FET. The method by which the other FETs of a FET stack are enslaved to the signal-input FET must cooperate with the method employed to properly bias the FETs. Accordingly, enslavement and biasing are addressed together.

In RF PAs generally according to FIG. 1, the peak voltage of drive output node 106 (with respect to circuit common 104) will often exceed twice the available supply voltage $V_{DD}$ 114. As such, bias voltages as required for the driver elements of FIG. 2 may not be readily available. This lack may be remedied by recourse, for example, to a charge pump. A charge pump that is preferred from the standpoint of minimal noise generation is described in commonly owned and copending U.S. patent application Ser. No. 10/658,154, "Low-Noise Charge Pump Method and Apparatus," which is hereby incorporated in its entirety by reference. As described therein in detail, a low-current voltage source may be readily established at any desired voltage. Such voltage source may be provided, as needed, to any of the bias voltage inputs $VB_2$ 210 to $VB_N$ 218 in FIG. 2.

FIG. 7 illustrates a self-adjusting bias supply that may be employed to bias the FETs of a FET stack. As in FIG. 2, a signal input 206 is coupled to the gate of a signal-input FET $M_1$ 204. The source of the FET $M_1$ 204 is coupled to $VD_{REF}$ 202, while its drain is coupled in series with each subsequent FET of the stack, including $M_2$ 208 . . . $M_N$ 216. The drain of the last FET of the stack, MN 216, is coupled to Vdrive 224. To provide a bias voltage that reflects Vdrive 224, a diode (or equivalent) $D_B$ 702 charges a bias supply capacitor $C_B$ 704 to Vbias 706. Vbias will charge to approximately Vpeak, the peak value of Vdrive 224 with respect to $Vd_{REF}$ 202. If a time constant associated with CB 704 is sufficiently long, then Vbias will remain substantially at this value. The time constant is the product of the capacitance of $C_B$ 704 multiplied by the resistance, to $Vd_{REF}$ 202, of the resistive voltage divider having N resistors including $R_{B1}$ 708, $RB_2$ 710, . . . , and $RB_N$ 712. The total resistance of this voltage divider may be designated $R_B$sum.

With respect to Equations 1, 2 and 3 that are set forth above, "X" represents the position of the particular FET in a stack, and N represents the total number of FETs in such stack. Assuming that all FETs are approximately identical, it may be seen that:

$$RB_1 = RB_2 = \ldots = RB_{(N-1)} \quad \text{(Eqn. 4)},$$

and, accordingly, $$RB_N = (N-1)RB_1 \quad \text{(Eqn. 5)}.$$

In view of equations 1–5, it may be seen that, for the last FET of the stack (X=N), $$(C_{GX} + C_{OXX}) = C_{OX}(N-1)/(N-2) \quad \text{(Eqn. 6)},$$

$$RB_{X(equiv)} = RB_1(N-1)/2 \quad \text{(Eqn. 7)},$$

and $$RB_1 \geq 20(N-2)[C_{OX}(N-1)^2 f_0] \quad \text{(Eqn. 8)}.$$

Thus, for N=3, $RB_1 \geq 5C_{OX}/f_0$, and $RB_1$ declines monotonically as N increases (for given values of $C_{OX}$ & $f_0$).

The total resistance $R_B$sum of the resistive divider described above, in which the lower (N−1) resistors are $RB_1$ and the top (or Nth) resistor is the sum of the lower resistors, is simply $2(N-1)RB_1$. The ripple on Vbias 706 may be acceptably low if the time constant $C_B(R_B \text{sum}) \geq 10/f_0$. Coupling that criteria with Eqn. 8 yields $$C_B \geq C_{OX}(N-1)/(N-2)/4 \quad \text{(Eqn. 9)}.$$

Thus, for N=3, $C_B \geq C_{OX}/2$. As N increases, smaller values of $C_B$ (with respect to $C_{OX}$) will be required to achieve the same ripple voltage.

A significant ripple voltage is not necessarily a problem, and $C_B$ may desirably assume even smaller values if rapid self-adjustment response is required. Indeed, in view of the filtering effected by each gate bypass capacitor $CG_X$ in conjunction with $RB_{X(equiv)}$, an average value is the main consideration for Vbias. However, if the average value of Vbias is permitted to decline significantly below Vpeak for any reason, including the presence of substantial ripple on $C_B$, the skilled person will understand that the resistive divider values should be adjusted accordingly.

Figure 8:
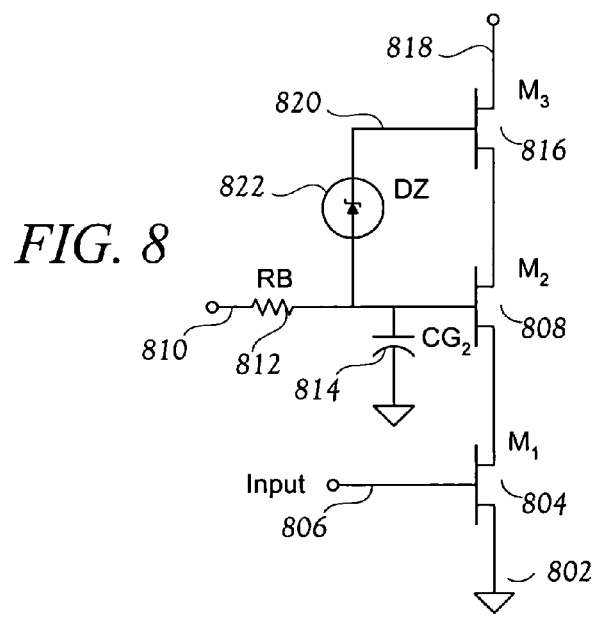
FIG. 8 is a simplified schematic diagram illustrating an alternative method of biasing FETs of a FET stack.

FIG. 8 illustrates an alternative for providing both bias and gate coupling for FETs $M_3$ and above (X≧3). A reference 802 is coupled to the source of a signal-input FET $M_1$ 804, the gate of which is coupled to an input signal 806. The drain of $M_1$ 804 is coupled to the source of a second FET $M_2$ 808. A bias voltage is applied to a bias input 810, which is coupled via a bias resistance RB 812 to the gate of $M_2$ 808, and to a relatively large capacitance $CG_2$ 814. The drain of $M_2$ 808 is coupled to the source of a third FET of the stack, $M_3$ 816. The drain of $M_3$ 816 may be coupled to a further FET stage, if present. However, the drain of the FET of the last stage, $M_3$ 816 as shown in FIG. 8, is coupled to an output node Vdrive 818.

The gate 820 of FET $M_3$ 816 may be coupled to the base of the preceding stage FET $M_2$ 808 via a zener diode DZ 822. DZ 822 may have a conduction threshold knee at approximately the maximum desired value for $V_{DS}$ of $M_3$ 816. (A circuit operating similarly to a zener diode may be used instead of DZ 822.) Additional FET stages designated by subscripts "Y" may be added. For such additional stages, corresponding additional zener diodes may be employed in like manner as DZ 822, i.e., anode to the gate of additional FET MY, and cathode to the gate of $M_{(Y-1)}$.

Alternative Configurations and Extensions

The FET stacks described above with respect to FIGS. 1–8 employ N-channel FETs (N-FETs). P-channel FET (P-FET) stacks may be fabricated analogously, by reversing the polarity of each voltage and polarized component associated with the stack. The P-FET stack reference voltage will generally be coupled to the source of a first, signal-input FET $M_{P1}$. Such inverted circuits will operate according to substantially the same principles as the N-FET stack circuits described above. For example, Vdrive 818 may be negative with respect to reference 802 in FIG. 8 if all FETs are P-channel, and the zener DZ 822 connection is reversed (anode and cathode exchanged).

Figure 9:
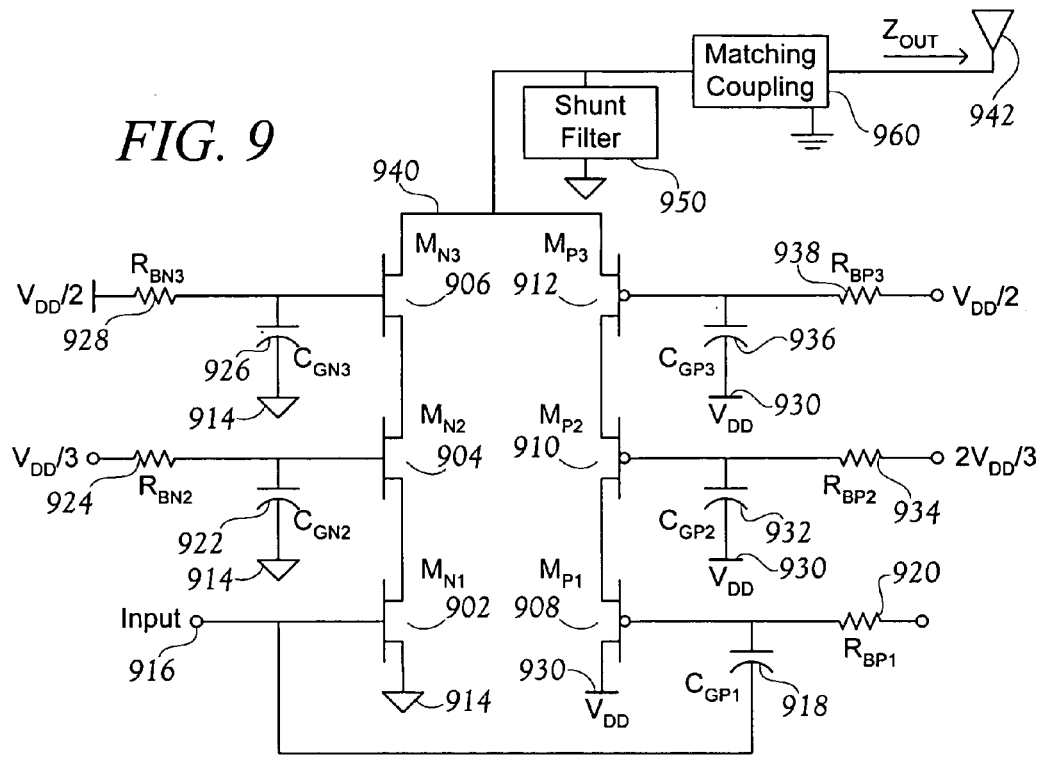
FIG. 9 is a simplified schematic diagram of a Class D PA employing complementary stacked-FET drive elements.

FIG. 9 is an exemplary circuit that employs both an N-channel FET stack comprising N-channel FETs $M_{N1}$ 902, $M_{N2}$ 904 and $M_{N3}$ 906, plus a P-channel FET stack comprising P-channel FETs $M_{P1}$ 908, $M_{P2}$ 910 and $M_{P3}$ 912. For Class D operation, an input square wave may be provided with respect to common 914 at the input 916 to the N-FET stack, and coupled to an input for the P-FET stack on the gate of $M_{P3}$ 912 via a capacitor $C_{GP1}$ 918. A bias voltage, set for example to one half of $V_{GS}$(on) below the P-FET stack reference $V_{DD}$ 930, may be provided for $M_{P1}$ 908 via a bias resistor $RB_{P1}$ 920. Alternatively, the capacitor $C_{GP1}$ 918 and the bias resistor $R_{BP1}$ 920 may be deleted, and the input 916 and the gate of $M_{P1}$ 908 may each be driven, instead, by means of an appropriate non-overlap clock generator (not shown).

Control of the N-FETs $M_{N2}$ 904 and $M_{N3}$ 906 is substantially as described with respect to FIG. 2 (for N=3). The gate of $M_{N2}$ 904 is coupled to common (i.e., decoupled) via a capacitor $C_{GN2}$ 922 having a relatively large value, and may be biased to about $(V_{DD}/3)$ volts via a bias resistor $R_{BN2}$ 924. The gate of $M_{N3}$ 906 is decoupled to common via a capacitor $C_{GN3}$ 926 having a value calculated as described with respect to FIG. 2, and may be biased to $(V_{DD}/2)$ volts via a bias resistor $R_{BN3}$ 928.

The P-FET stack is controlled analogously as the N-FET stack. The polarities of the bias voltages are inverted, and referenced to the "reference voltage" of the P-FET stack, which in this case is $V_{DD}$ 930. For purposes of capacitively decoupling the P-FET gates, the fact that the P-FET reference voltage is $V_{DD}$ 930 is likely to make little difference, because $V_{DD}$ is typically closely coupled to the circuit common 914 that is the reference for the N-FETs. Therefore, decoupling capacitors 932 and 936 may alternatively be connected to circuit common 914. As shown, however, the gate of $M_{P2}$ 910 is decoupled to $V_{DD}$ via a relatively large capacitor $C_{GP2}$ 932, and biased to about ⅔ $V_{DD}$ via a bias resistor $R_{BP2}$ 934. The gate of $M_{P3}$ 912 is decoupled to $V_{DD}$ via a capacitor $C_{GP3}$ 936. The value of $C_{GP3}$ 936 may be calculated as described with respect to FIG. 2 for X=3 and N=3. The gate of $M_{P3}$ 912 is biased to about $V_{DD}/2$ via a bias resistor $R_{BP3}$ 938.

An output voltage Vdrive 940 will be driven between common and $V_{DD}$, according to whether the N-FET stack is conducting or the P-FET stack is conducting. The output Vdrive 940 may be shunt filtered by a shunt filter 950, and may be processed by a matching and coupling circuit 960, as described below in more detail with respect to FIG. 10. From the matching and coupling circuit 960 the signal may proceed to an antenna 942, typically via a transmission line, one or more further filter sections, and an RF switch (not shown).

Figure 10:
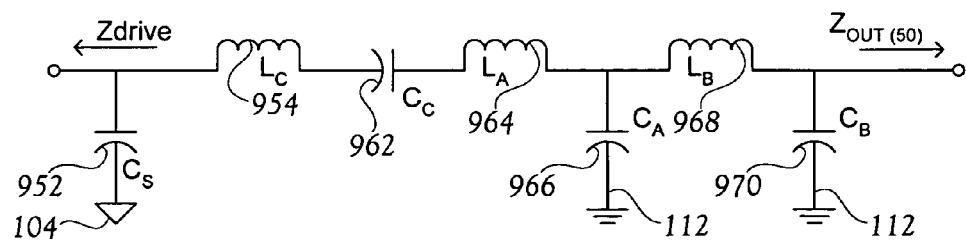
FIG. 10 is a schematic diagram of exemplary output filtering for a Class D PA such as represented in FIG. 9.

The shunt filter 950 of FIG. 9 may be similar to that shown in FIG. 4, or that shown in FIG. 6. The matching and coupling circuit 960 of FIG. 9 may, for example, be similar to that shown in FIG. 3. However, FIG. 10 illustrates filtering that may be employed for both blocks 950 and 960 in the circuit of FIG. 9. The capacitor $C_S$ 952 may serve as the shunt filter 950. The remainder of FIG. 10 may function as the matching and coupling circuit 960 of FIG. 9. An inductor $L_C$ 954 may comprise a physical coupling connection. A coupling capacitor $C_C$ 962 serves to block DC. $L_A$ 964, $C_A$ 966, $L_B$ 968 and $C_B$ 970 may be configured for matching to the output impedance $Z_{OUT}$, which is typically 50 ohms.

CONCLUSION

The foregoing description illustrates exemplary implementations, and novel features, of a method and apparatus that employs stacked transistors to control conduction between a pair of nodes in an integrated circuit. The skilled person will understand that various omissions, substitutions, and changes in the form and details of the methods and apparatus illustrated may be made without departing from the scope of the invention. Numerous alternative implementations have been described, but it is impractical to list all embodiments explicitly. As such, each practical combination of the apparatus or method alternatives that are set forth above, and/or are shown in the attached figures, constitutes a distinct alternative embodiment of the subject apparatus or methods. Each practical combination of equivalents of such apparatus or method alternatives also constitutes a distinct alternative embodiment of the subject apparatus or methods. Therefore, the scope of the presented invention should be determined only by reference to the appended claims, and is not to be limited by features illustrated in the foregoing description except insofar as such limitation is recited, or intentionally implicated, in an appended claim.

All variations coming within the meaning and range of equivalency of the various claim elements are embraced within the scope of the corresponding claim. Each claim set forth below is intended to encompass any system or method that differs only insubstantially from the literal language of such claim, as long as such system or method is not, in fact, an embodiment of the prior art. To this end, each described element in each claim should be construed as broadly as possible, and moreover should be understood to encompass any equivalent to such element insofar as possible without also encompassing the prior art.

What is claimed is:

1. An integrated RF Power Amplifier (PA) circuit, comprising:
   a) an input node to accept an input signal with respect to a reference voltage Vref, coupled to a gate G1 of a first FET M1;
   b) a plurality of additional FETs M2 to Mn having corresponding gates G2 to Gn and a same polarity as M1 and coupled in series with M1 to form a control circuit configured to control conduction between the reference voltage and an output drive node, wherein FETs M2 to Mn are each enslaved to M1;
   c) an output coupling capacitor, coupling the output drive node to an output load node; and
   d) a corresponding predominantly capacitive element connected directly between each gate, G2 to Gn, and Vref.

2. The integrated circuit of claim 1, further comprising (d) an output power control input node coupled to a power controlling FET that is coupled in series connection with M1.

3. The integrated circuit of claim 2, wherein the power controlling FET is disposed between the reference voltage and a power supply voltage external to the PA.

4. The integrated circuit of claim 2, wherein the power controlling FET is one of the FETs M2 to Mn.

5. The integrated circuit of claim 1, further comprising a low-pass filter disposed in series with the output coupling capacitor between the output drive node and the output load node.

6. An integrated RF Power Amplifier (PA) circuit, comprising:
   a) an input node to accept an input signal with respect to a reference voltage Vref, coupled to a gate G1 of a first FET M1;
   b) a plurality of additional FETs M2 to Mn having a same polarity as M1 and coupled in series with M1 to form a control circuit configured to control conduction between the reference voltage and an output drive node, wherein FETs M2 to Mn are each enslaved to M1;
   c) an output coupling capacitor coupling the output drive node to an output load node; and
   (d) a shunt resonant circuit coupled between the output drive node and the reference voltage and configured to have a minimal impedance at a frequency that is a harmonic of a center operation frequency $F_0$ of the PA.

7. The integrated circuit of claim 6, further comprising a plurality of shunt resonant circuits (d).

8. An integrated circuit including a multiple-FET stack circuit for controlling conduction between a drive output node Vdrive and a reference voltage node Vref under control of an input signal applied between an input signal node and Vref, the integrated circuit comprising:
   a) a series stack of J same-polarity FETs $M_N$, N an integer between 1 and J and J an integer 3 or greater, each FET $M_N$ having a source $S_N$, a gate $G_N$ and a drain $D_N$,
   b) an input signal node coupled to the gate $G_1$ of a signal-input FET $M_1$ of the FET stack;

c) for 0<N<J, a series coupling between each drain $D_N$ and the source $S_{(N+1)}$ of a next higher FET $M_{(N+1)}$ of the FET stack;

d) for 1<N≦J, a gate coupling element that is predominantly capacitive connected directly between between each gate $G_N$ and Vref, in a configuration enslaving each FET $M_{(N+1)}$ to $M_1$ so as to conduct substantially concurrently with, and under control of, conduction in $M_1$;

e) a source coupling for the FET stack between $S_1$ and Vref; and f) a drain coupling for the FET stack between $D_J$ and Vdrive.

9. The integrated circuit of claim 8, wherein a peak value of voltage on Vdrive with respect to Vref, Vdrive(peak), is divided approximately uniformly across all J FETS such that each drain-source voltage $Vds_{(N)}$ is approximately Vdrive(peak)/J.

10. The integrated circuit of claim 8, wherein each $G_N$ has a capacitance $Cg_N$ to a channel of the FET, and each gate coupling comprises a capacitance of about $Cg_N/(N-2)$ between $G_N$ and $S_1$ for each N, 2<N≦J.

11. An integrated circuit including a multiple-FET stack circuit for controlling conduction between a drive output node Vdrive and a reference voltage node Vref under control of an input signal applied between an input signal node and Vref the integrated circuit comprising:

a) a series stack of J same-polarity FETs $M_N$, N an integer between 1 and J and J an integer 3 or greater, each FET $M_N$ having a source $S_N$, a gate $G_N$ and a drain $D_N$, b) an input signal node coupled to the gate $G_1$ of a signal-input FET $M_1$ of the FET stack;

c) for 0<N<J, a series coupling between each drain $D_N$ and the source $S_{(N+1)}$ of a next higher FET $M_{(N+1)}$ of the FET stack;

d) for 1<N≦J, a gate coupling between each gate $G_N$ and at least one lower FET $M_{(N-K)}$, K an integer between 1 and (N-1), in a configuration enslaving each FET $M_{(N+1)}$ to $M_1$ so as to conduct substantially concurrently with, and under control of, conduction in $M_1$;

e) a source coupling for the FET stack between $S_1$ and Vref; and f) a drain coupling for the FET stack between $D_J$ and Vdrive; wherein g) a gate coupling circuit for a FET $M_N$, 2<N≦J, comprises a zener diode.

12. The integrated circuit of claim 8, further comprising a resistive divider for biasing a FET $M_N$, N>1, of the FET stack.

13. An integrated circuit including a multiple-FET stack circuit for controlling conduction between a drive output node Vdrive and a reference voltage node Vref under control of an input signal applied between an input signal node and Vref, the integrated circuit comprising:

a) a series stack of J same-polarity FETs $M_N$, N an integer between 1 and J and J an integer 3 or greater, each FET $M_N$ having a source $S_N$, a gate $G_N$ and a drain $D_N$, b) an input signal node coupled to the gate $G_1$ of a signal-input FET $M_1$ of the FET stack;

c) for 0<N<J, a series coupling between each drain $D_N$ and the source $S_{(N+1)}$ of a next higher FET $M_{(N+1)}$ of the FET stack;

d) for 1<N≦J, a gate coupling between each gate $G_N$ and at least one lower FET $M_{(N-K)}$, K an integer between 1 and (N-1), in a configuration enslaving each FET $M_{(N+1)}$ to $M_1$ so as to conduct substantially concurrently with, and under control of, conduction in $M_1$;

e) a source coupling for the FET stack between $S_1$ and Vref;

f) a drain coupling for the FET stack between $D_J$ and Vdrive; and g) a diode configured in a charge-pump circuit for biasing a FET $M_N$, N>1, of the FET stack.

14. A Class A, B or C RF PA comprising an integrated circuit according to claim 8, wherein the multiple-FET stack is configured as a primary amplifying device of the Class A, B or C RF PA.

15. A quad mixer comprising an integrated circuit according to claim 8.

16. A Class F RF PA comprising an integrated circuit according to claim 8, wherein the multiple-FET stack is configured as a primary amplifying device of the Class F RF PA.

17. An RF power amplifier (PA) circuit configured for operation at a center frequency $F_0$, the PA circuit integrated onto a monolithic substrate and comprising:

a) a stack of J FETs $M_N$, for each integer value of N between 1and J, J an integer greater than one, each FET $M_N$ having a source $S_N$, a gate $G_N$ and a drain $D_N$, the stack configured to control an output signal Vdrive with respect to a reference voltage Vref at a characteristic impedance of Zdrive, the FET stack including i) an input signal node coupled to the gate $G_1$ of a lowest FET $M_1$, ii) channel couplings from the source $S_N$ of each FET $M_N$, for N>1, to the drain $D_{(N-1)}$ of a next lower FET $M_{(M-1)}$, iii) gate couplings from $D_N$ of each FET $M_N$; for N>1, to a lower FET so as to cause $M_N$ to conduct substantially concurrently with $M_1$, iv) a FET stack reference coupling between $S_1$ and Vref, and v) a FET stack output coupling between $D_J$ and Vdrive; and b) a shunt filter circuit configured to effect a shunt path between Vref and Vdrive having a local minimum impedance at approximately a harmonic frequency of $F_0$.

18. The PA of claim 17, wherein the FET stack a) is configured to control Vdrive at a characteristic impedance of Zdrive, and wherein the local minimum impedance of the shunt filter circuit is approximately a complex conjugate of Zdrive.

19. A wireless transmitter comprising a PA according to claim 18, further comprising an antenna having a characteristic impedance Zant coupled to the PA via an impedance matching filter.

20. The PA of claim 17, the shunt filter circuit b) is configured to have a first local minimum impedance at a first shunt frequency $F_{SH1}$ approximately equal to $2 \cdot F_0$, and a second local minimum impedance at a second shunt frequency $F_{SH2}$ approximately equal to $3 \cdot F_0$.

21. The PA of claim 19, wherein the FET stack a) is configured to control Vdrive at a characteristic impedance of Zdrive, and wherein the first and second local minimum impedances of the shunt filter are both approximately matched to Zdrive.

22. The PA of claim 17, wherein the shunt filter circuit b) further comprises a controllable device for changing the frequency of the local minimum impedance to accommodate changes in the operating center frequency $F_0$.

23. The PA of claim 17, wherein the local minimum impedance of the shunt filter circuit includes a non-zero and substantially resistive component.

24. The PA of claim 23, wherein the local minimum impedance of the shunt filter circuit includes a non-zero and substantially resistive component. No imaginary component.

25. An integrated RF Power Amplifier (PA) circuit, comprising:
   a) an input node to accept an input signal with respect to a first reference voltage Vref1, coupled to a gate G1 of a first FET M1 having a first polarity;
   b) a plurality of additional FETs M2 to Mn having the same polarity as M1 and coupled in series with M1 to form a control circuit configured to control conduction between the reference voltage and an output drive node, wherein FETs M2 to Mn are each enslaved to M1;
   c) a FET −M1 having opposite polarity than FET M1, having a channel coupled to a second supply voltage reference Vref2 different from Vref1, and having a gate coupled to the input signal without phase inversion; and
   d) a plurality of additional FETs −M2 to −Mn having the same polarity as FET −M1 and coupled in series with −M1 to form a control circuit configured to control conduction between the second supply voltage reference Vref2 and the output drive node, wherein FETs −M2 to −Mn are each enslaved to −M1.

26. The PA of claim 25, wherein each gate of FETs M2 to Mn is capacitively decoupled to another of the FETs in series therewith, and each gate of FETs −M2 to −Mn is capacitively decoupled to another of the FETs in series therewith.

27. The PA of claim 26, wherein each gate of FETs M2 to Mn is capacitively decoupled to Vref1, and each gate of FETs −M2 to −Mn is capacitively decoupled to Vref2.

* * * * *